United States Patent [19]

Jachowski

[11] Patent Number: 4,660,004

[45] Date of Patent: Apr. 21, 1987

[54] DUPLEXER INCLUDING INTEGRAL INTERDIGITAL TRANSMITTER AND RECEIVER FILTERS AND THREE-QUARTER WAVELENGTH ANTENNA TRANSFORMER SECTION

[75] Inventor: Ronald E. Jachowski, Belmont, Calif.

[73] Assignee: Orion Industries, Inc., Cleveland, Ohio

[21] Appl. No.: 732,161

[22] Filed: May 8, 1985

[51] Int. Cl.[4] .......................... H01P 2/05; H03H 7/46

[52] U.S. Cl. .................................... 333/134; 333/203; 455/78

[58] Field of Search ............... 333/203, 204, 134, 135, 333/126, 129; 370/24, 25, 32, 51; 455/78, 83

[56] References Cited

U.S. PATENT DOCUMENTS

| | | | |
|---|---|---|---|
| 3,597,709 | 8/1971 | Rhodes | 333/203 |
| 3,733,608 | 5/1973 | McGhay et al. | 333/134 X |
| 3,818,389 | 6/1974 | Fisher | 333/203 |
| 4,091,344 | 5/1978 | La Tourette | 333/134 |

FOREIGN PATENT DOCUMENTS

| | | | |
|---|---|---|---|
| 3028925 | 2/1982 | Fed. Rep. of Germany | 333/134 |
| 0103656 | 8/1979 | Japan | 333/126 |
| 0011004 | 1/1984 | Japan | 333/204 |
| 0720587 | 3/1980 | U.S.S.R. | 333/134 |

*Primary Examiner*—Eugene R. Laroche
*Assistant Examiner*—Benny T. Lee
*Attorney, Agent, or Firm*—Dressler, Goldsmith, Shore, Sutker & Milnamow Ltd.

[57] ABSTRACT

A duplexer includes an integral interdigital transmitter filter and parallel interdigital receiver filter in a common housing. A three-quarter wavelength antenna transformer section couples rf energy from the transmitter filter to an antenna and also couples rf energy from the antenna to the receiver filter and to an antenna cable connector.

3 Claims, 6 Drawing Figures

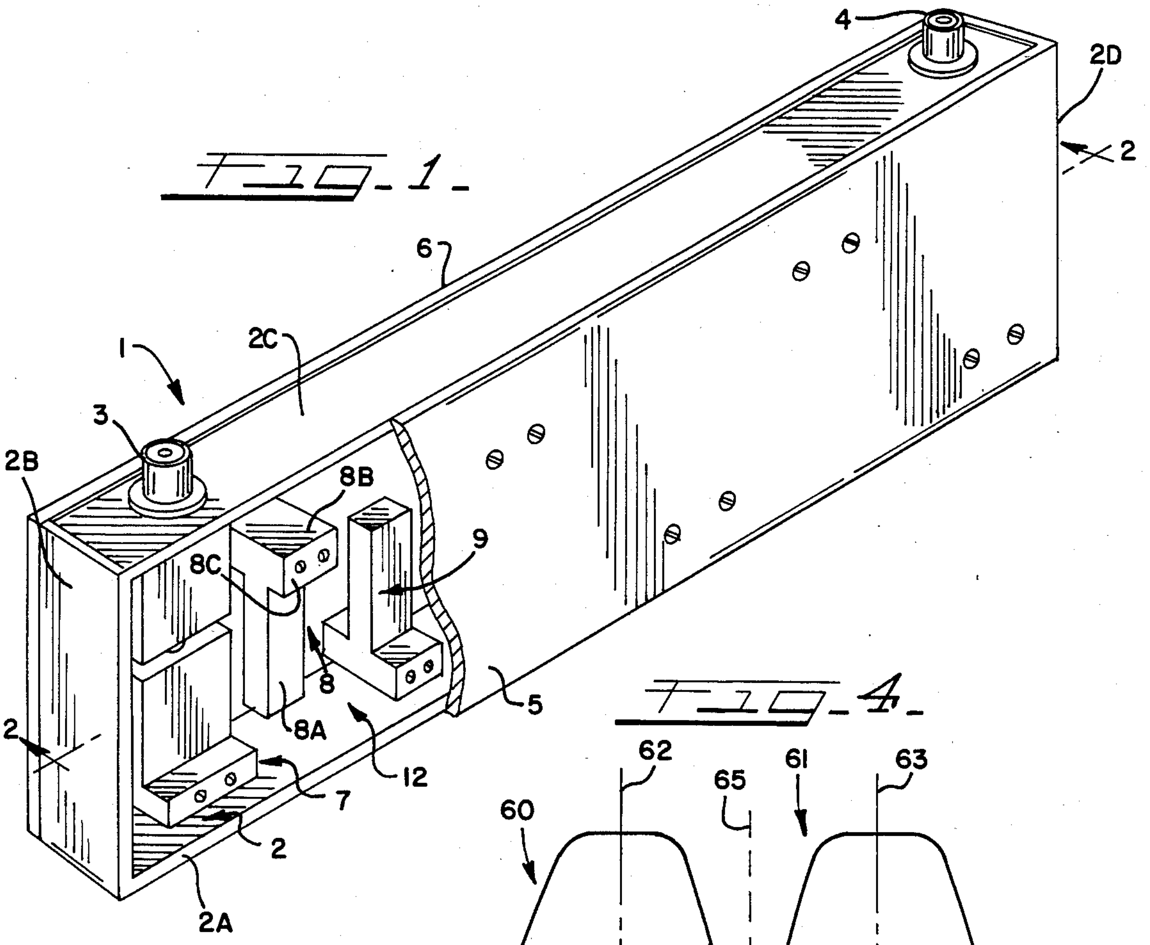
Fig. 1
Fig. 4
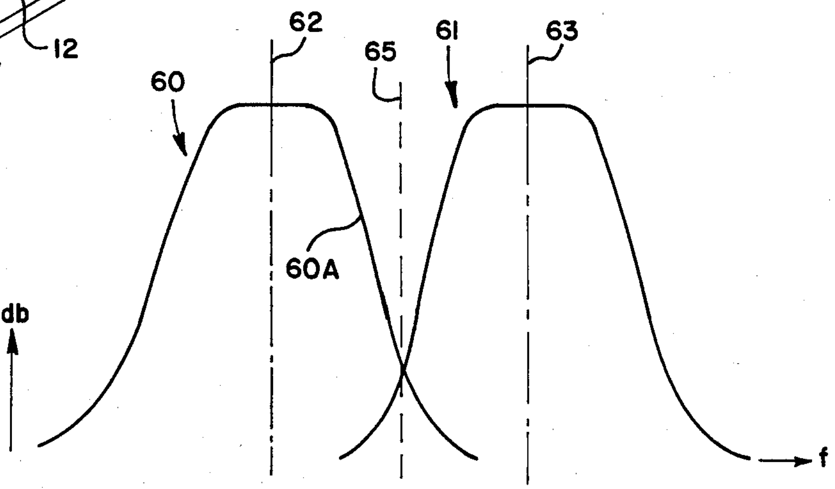
Fig. 2
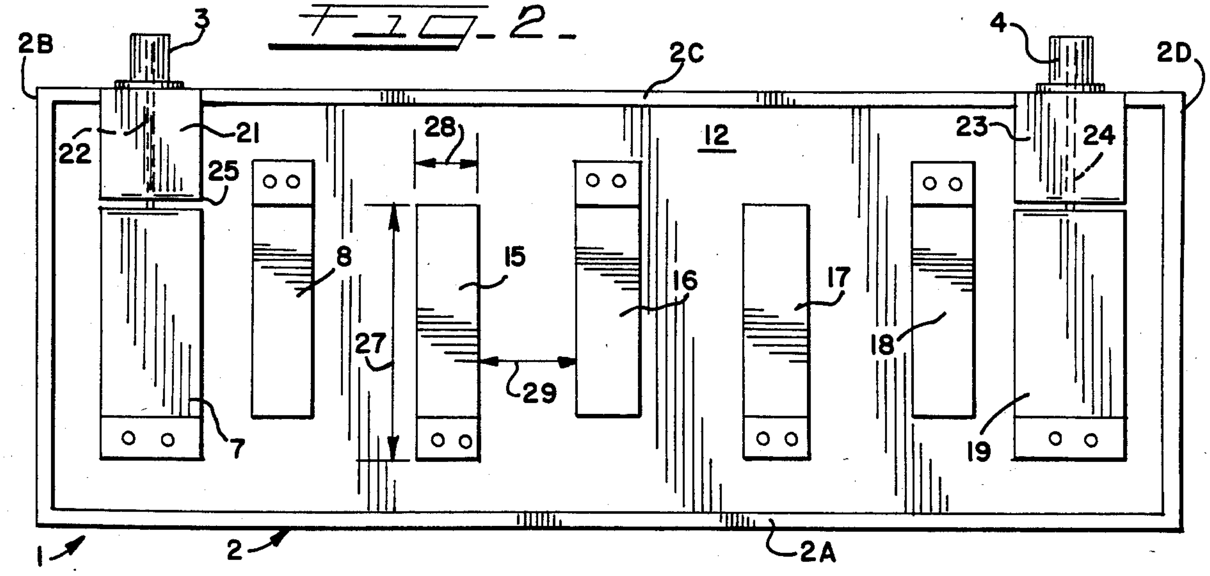

DUPLEXER INCLUDING INTEGRAL INTERDIGITAL TRANSMITTER AND RECEIVER FILTERS AND THREE-QUARTER WAVELENGTH ANTENNA TRANSFORMER SECTION

BACKGROUND OF THE INVENTION

The invention relates to interdigital filters, and especially to duplexers including multiple interdigital filters within a single frame, functioning as duplexers.

Interdigital filters are well-known to those skilled in the art of microwave frequency apparatus, and are described in "Interdigital Band-Pass Filters", by G. L. Matthaei, IRE Transactions on Microwave Theory Techniques, November, 1962, page 479 and also in the text "Microwave Filter, Impedance-Matching Networks and Coupling Structures", by G. Matthaei, L. Young, and E. M. T. Jones, 1980, published by Artech House, Inc. Interdigital filters include a series of spaced, parallel conductive quarter wavelength resonators in a rectangular conductive housing and arranged in an interdigitated fashion in the sense that opposite ends of adjacent resonators are electrically grounded to the housing. The center frequency of an interdigital band-pass filter is determined by the lengths of its resonators. The interdigital filter bandwidth is determined by the spacing between adjacent resonators, and the width of each resonator determines its impedance. The number of resonators determines the selectivity of the interdigital filter, i.e., the steepness of the "skirt" of its band-pass characteristic.

Duplexers are widely used to couple transmitters and receivers to a common antenna. Multiple cavity interdigital filters also are known. U.S. Pat. No. 3,597,709 discloses a structure in which two separate interdigital filters are joined by a common wall having apertures therein to allow coupling of rf energy between the two cavities. U.S. Pat. No. 3,818,389 discloses an interdigital filter structure in which two cavities bounded by the same parallel face plates share a common output resonator. However, the cavities are disposed in end-to-end relationship, with the common resonator being located between them. This structure would not be practical where high selectivity and minimum physical length of the structure is needed. Neither of the foregoing dual cavity interdigital filter structures solve the problems associated with making a minimum size duplexer with interdigital filter structures.

Although duplexers such as the one shown in FIG. 5 have been constructed using interdigital filters, wherein a transmitter 91 and a receiver 96 are coupled to a common antenna 101, it is necessary to very precisely cut the lengths of cables 94 and 99, which couple interdigital filters 93 and 98, respectively, to a T-connector 95 that is connected to the antenna cable 100.

There is an unmet need for a practical interdigital filter duplexer structure that occupies minimum front panel space in an equipment rack and avoids the need to provide precisely cut lengths of cable to connect the "transmitter" filter and "receiver" filter of a duplexer to the common antenna.

SUMMARY OF THE INVENTION

It is another object of the invention to provide an improved interdigital filter duplexer structure with efficient internal coupling between the multiple filters thereof.

It is another object of the invention to provide a duplexer that does not require cable coupling between its filters.

It is another object of the invention to provide an improved multiple filter interdigital filter structure that occupies minimum front panel space.

Briefly described, and in accordance with one embodiment thereof, the invention provides a duplexer that includes a transmitter filter and a receiver filter, each including a plurality of resonators disposed in a single frame with a narrow common conductive wall therebetween and a larger transformer section that couples rf energy from the transmitter filter to a common antenna and also couples rf energy from the antenna to the receiver filter. In this described embodiment of the invention, the transmitter filter and receiver filter are interdigital filters, having quarter wavelength resonators, and the large transformer section is a three-quarter wavelength line having alternate quarter wave sections of its standing waveform aligned with the resonators of the transmitter and receiver filters, respectively. The length of each of the resonators in the first and second filters is one-quarter wavelength. The length of the inter-filter transformer section is three-fourths of a wavelength. In another described embodiment of the invention, additional filters are provided in the same frame as the first and second filters, with the antenna transformer sections extending to provide odd numbered quarter wave sections in alignment with each additional filter.

BRIEF DESCRIPTION OF THE DRAWINGS

FIG. 1 is a perspective partial cutaway view of an improved interdigital filter of the present invention.

FIG. 2 is a section view taken along section line 2—2 of FIG. 1.

FIG. 4 is a diagram showing the band-pass characteristic of the duplexer of FIG. 3.

DESCRIPTION OF THE INVENTION

Figure 5:
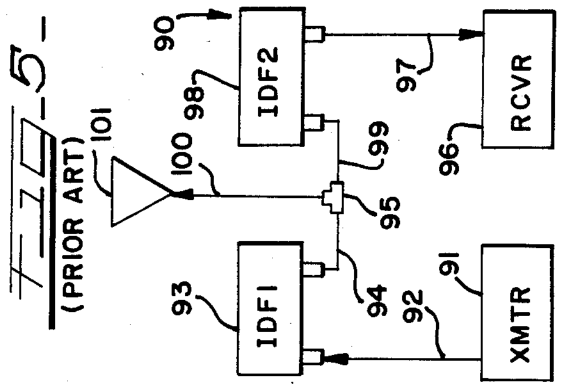
FIG. 5 (PRIOR ART)
FIG. 5 is a block diagram illustrating the structure of a prior art duplexer.

Referring now to FIGS. 1 and 2, interdigital filter 1 includes a rectangular conductive frame 2 including bottom member 2A, top member 2C and end members 2B and 2D defining a thin, elongated rectangular cavity 12. The opposed major faces of interdigital filter 1 are covered by conductive face plates 5 and 6. Interdigital filter 1 includes, within cavity 12, a first group of resonators including 8, 15, 16, 17, and 18, and transformer sections 7 and 19. The latter elements are referred to as "transformer sections" because they "transform" cable conductor to a rectangular line conductor (which then can couple electromagnetic energy to a resonator). In accordance with the present invention, each of the resonators has a T-shaped configuration including a mounting base that is attached by screws to the inner surfaces of the conductive face plates 5 and 6. Each resonator also includes a relatively thin resonator section perpendicular to and centrally supported by the mounting base. For example, in FIG. 1, resonator 8 includes mounting base 8B and thin vertical resonator section 8A. Resonator 9 is similarly shaped. The transformer sections have a similar T-shaped configuration.

As best seen in FIG. 2, transformer section 7 has its free end connected across a narrow gap 25 to a conductor 22 that extends through a conductive block 21 to the center conductor of a coaxial cable connector 3. Similarly, transformer section 19 has its free end connected across a narrow gap 26 to a conductor 24 extending through a rectangular conductive block 23 to the center conductor of a cable connector 4.

The mounting bases of alternate resonators 15 and 17 are attached to lower portions of the conductive faces 5 and 6 of interdigial filter 1. The remaining resonators 8, 16, and 18 have their mounting bases attached to upper portions of the conductive faces 5 and 6. Transformer sections 7 and 9 have their mounting bases attached to lower portions of conductive faces 5 and 6. The band-pass characteristic of interdigital filter 1 can have a shape such as the one indicated by reference numerals 60, 60A in FIG. 4. (The band-pass characteristic 61 will be described subsequently.) The center frequency, designated by line 62 in FIG. 4, of interdigital filter 1 is determined by the length 27 of the resonators 8, 15, 16, 17, and 18. The bandwidth of interdigital filter 1 is determined by the spacing 29 between resonators 8, 15, 16, 17, and 18, the smaller spacing between transformer section 7 and resonator 8, and the smaller spacing between resonator 18 and transformer section 19. (The smaller spacings referred to are required because of the different impedances of the resonators and the transformer sections.) The width 28 of each resonator determines the impedance of that resonator. An optimum impedance for a resonator is approximately 70 ohms. However, transformer sections 7 and 19 are wider to lower their impedance to 50 ohms in order to accomplish impedance matching to 50 ohm cables (not shown) that are connected to coaxial cable connectors 3 and 4.

As previously mentioned, the selectivity of an interdigital filter, i.e., the extent to which it rejects out-band signals, is determined by the number of resonators therein, because the more resonators there are in filter 12, the more out-band energy is attentuated as the signal passes from one end of the interdigital filter to the other.

In accordance with usual practice, frame 2, face plates 5 and 6, and the resonators and the transformer sections, can be composed of copper, coated with silver to provide high surface conductivity. The T-shaped structure of the resonators allows them to be cut from extruded copper sections, significantly decreasing the manufacturing costs of the interdigital filter structure of the present invention.

Figure 3:
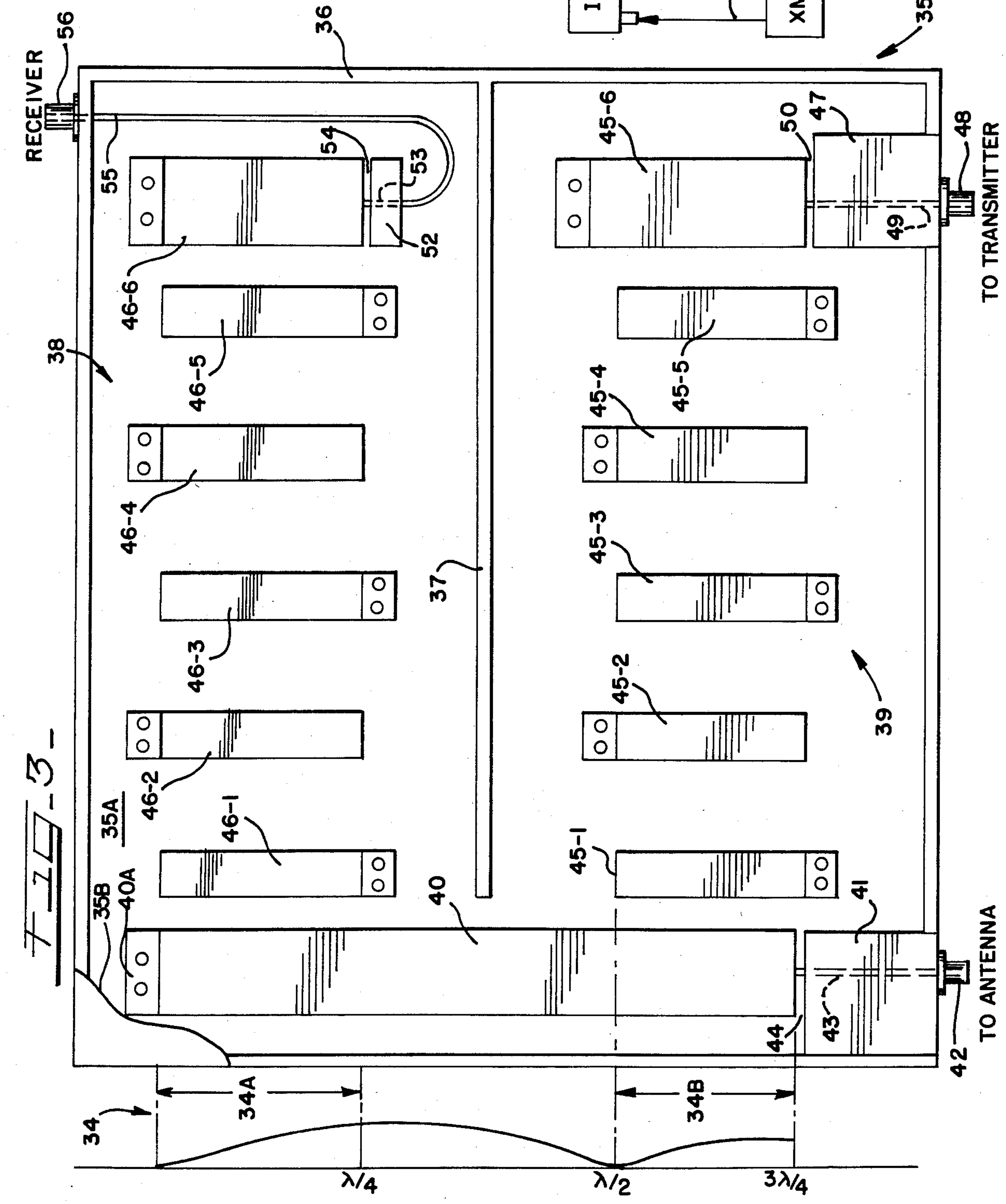
FIG. 3 is a section view of a duplexer of the present invention.

Referring next to FIG. 3, a unitary, dual cavity interdigital filter structure with internally coupling of the filter to an "antenna transformer section" 40 to provide a duplexer 35 is illustrated. Conductor 43 extends through conductive block 41 to antenna connector 42. An impedance matching gap 44 is positioned between transformer section 40 and block 41. Duplexer 35 includes a "receiver filter" 38 including parallel, spaced resonators 46-1 throuth 46-5 and tranformer section 46-6 arranged essentially as described for FIGS. 1 and 2, and each equal in length to one-fourth of the receiver frequency wavelength. Receiver transformer section 46-6 is connected across a gap 54 by a conductor 53 extending through conductive block 52 to a conductor 55. Conductor 55 is routed between resonator 46-6 and frame 36 to a receiver cable connector 56.

Frame 36 includes a narrow conductive member 37 that extends between the opposite conductive faces 35A, 35B (such as 5 and 6 in FIG. 1), isolating receiver filter 38 from "transmitter filter" 39. Transmitter filter 39 includes spaced, parallel resonators 45-1 through 45-5 and transformer section 45-6 connected in essentially the manner previously described, and each equal in length to one-quarter of the transmitter frequency wavelenth. Transmitter transformer section 45-6 is electrically connected across an impedance matching gap 50 to conductor 49. Conductor 49 extends through conductive block 47 to the center connector conductor of a transmitter cable connector 48.

In accordance with the present invention, a larger "antenna transformer section" 40 has its mounting base 40-A attached to the upper portion of the face plate 35A (similar to face plates 5 and 6 in FIG. 1) of duplexer 35 and extends downward past conductive wall 37 and across transmitter filter 39. Transformer section 40 is parallel to and in the same plane as resonators 45-1, etc., and 46-1, etc., and has a length approximately equal to three-quarters of the transmitter or receiver frequency (which are closely spaced). Three-quarter wavelength transformer section 40 is connected across impedance matching gap 44 to the center conductor of antenna cable connector 42.

The correct alignment of three-quarter wavelength antenna transformer section 40 with the quarter wavelength resonators 45-1, etc., and 46-1, etc., is best shown by referring the voltage standing wave waveform 34 of transformer section 40, shown on the left side of FIG. 3. Its rising quarter wave portion 34A is aligned with receiver filter resonators 46-1, etc., and its next rising quarter wave section 34B is aligned with transmitter filter resonators 45-1, etc. This alignment optimizes electromagnetic coupling of rf energy at the receiver frequency and transmiter frequency to the receiver filter and transmitter filter, respectively.

For the purpose of explanation, it will be assumed that interdigital receiver filter 38 has the band-pass characteristic designated by reference numeral 60 in FIG. 4, and that the interdigital transmitter filter 39 has the band-pass characteristic designated by reference numeral 61 in FIG. 4. Thus, the receiver frequency is the frequency designated by dotted line 62, and the transmitter frequency is the frequency designated by dotted line 63.

I have discovered that the above-described structure, is very effective in coupling transmitter signals to the antenna and also in coupling received signals from the same antenna to the receiver connected to cable connector 56, while maintaining excellent isolation between the transmitter and receiver, and very low insertion loss also is achieved.

In a duplexer which I have constructed generally in accordance with FIG. 3, the insertion loss measured through either the transmitter filter 39 or the receiver filter 38 is only approximately 0.5 decibels. The attenuation in the reject bands of the receiver filter 38 and the transmitter filter 39 is greater than about 50 decibels. The described duplexer has frequencies selected for use in the mobile communications cellular bands, designed for communication at receiver frequencies in the range from 825 to 851 megahertz and transmitter frequencies in the range from 870 to 896 megahertz. The separation of receiver frequency 62 and transmitter frequency 63 is about 19 megahertz. For this duplexer, the separation of the thin conductive panels (such as 5 and 6 of FIG. 1), and hence the width of the resonator mounting bases, in FIG. 1 is one and one-half inches. The thicknesses of each of the resonators is approximately one-fourth of an inch.

Thus, the duplexer shown in FIG. 3 occupies less than two inches of vertical space in an equipment rack, has very low insertion loss of only about 0.5 decibels, and provides greater than 50 decibels of isolation between the receiver and the transmitter. Furthermore, no precisely cut cables need to be provided between the transmitter cavity and the receiver cavity, nor is any physical space required for such cables. The described duplexer 35 can be manufactured very inexpensively.

Figure 6:
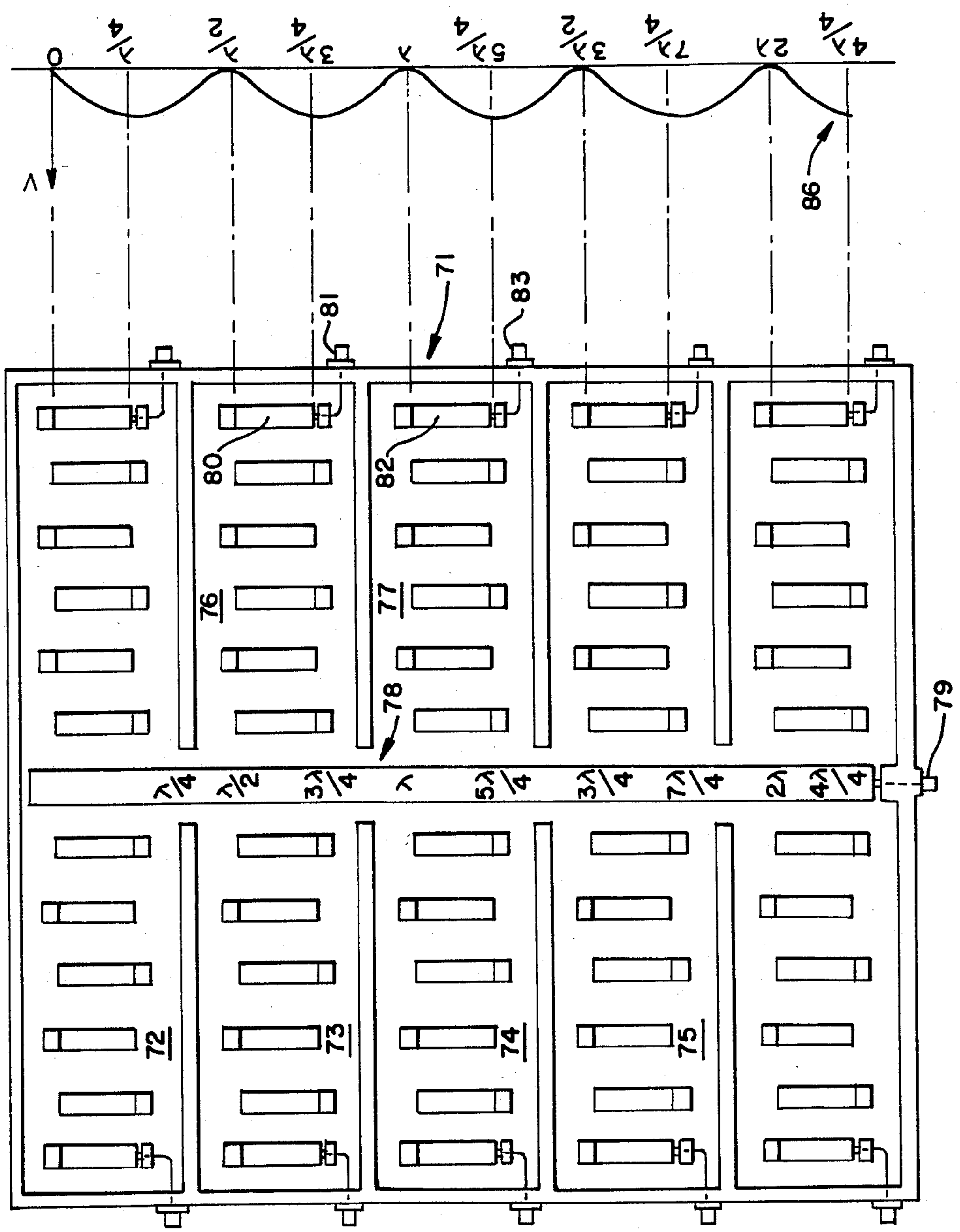
FIG. 6 is a section view of an alternate multiple-filter interdigital filter structure of the present invention.

The basic duplexer structure shown in FIG. 3 can be extended to include more cavities, such as 72, 73, 74, 75, 76, and 77 as shown in FIG. 6. A common or inter-filter transformer section 78, which is an odd multiple number of quarter wavelengths in length, is shared between all of the filters, both to the left and right thereof. Each of filters includes a typical interdigital filter arrangement of resonators and includes an end transformer section such as 80 or 82 coupled to a cable connector such as 81 or 83. The common inter-filter transformer section 78 is connected at its free end to the center conductor of a coaxial cable connector 79, which can, if desired, be fed to an antenna. Various combinations of receivers and transmitters can be connected to the various cable connectors. As a practical matter, the number of cavities that can be shared with a single inter-filter transformer section such as 78 is limited by frequency spread or separation of the various band-pass filters.

FIG. 6 includes a waveform 86 that represents the standing wave voltage of transformer section 78, and shows how the standing wave sections should be aligned with those of the rows of resonators which are coupled to resonator 78.

While the invention has been described with reference to several particular embodiments thereof, those skilled in the art will be able to make various modifications to the disclosed embodiments of the invention without departing from the true spirit and scope thereof. It is intended that all elements or steps which are equivalent to those of the embodiments of the invention described herein in that they accomplish substantially the same function in substantially the same way to achieve substantially the same result are equivalent to what is described herein. For example, a "transformer section" such as transformer section 40 in FIG. 3 can be used in essentially the same manner in a dual cavity comb-line filter structure in which the lengths of the resonators are approximately one-eighth of a wavelength, and the length of the common antenna resonator is three-quarters of a wavelength.

I claim:

1. A multiple filter microwave filtering device comprising:

(a) a first interdigital filter having a first predetermined resonant frequency, with a first group of spaced parallel resonators therein, said first group having a first and a second end;

(b) a second interdigital filter having a second predetermined resonant frequency, with a second group of spaced parallel resonators therein, said second group having a first and a second end;

(c) a first transformer section positioned adjacent said first end of said first group and first connecting means for electrically connecting said first transformer section to a first cable connector, and a second transformer section positioned adjacent said first end of said second group and second connecting means for electrically connecting said second transformer section to a second cable connector;

(d) a common transformer section extending adjacent said second end of said first filter and adjacent said second end of said second filter, said common transformer section having a predetermined first portion aligned with one of said resonators at said second end of said first group to couple rf energy having said first resonant frequency therebetween, and a predetermined second portion, spaced from said first portion, and aligned with one of said resonators at said second end of the second group to couple rf energy having said second resonant frequency therebetween;

(e) a conductive rectangular frame defining opposed, spaced apart major faces and bounding said first and second filters, said frame including an elongated conductive divider extending between said first and second filters and nearly to said common transformer section, and thereby separating the first and second filters, a third cable connector affixed to said frame, and first and second spaced apart conductive face plates attached to spaced apart surfaces of said frame, covering said major faces with said first and second filters positioned therebetween; and (f) means for electrically connecting a selected region of said common transformer section to said third cable connector wherein the length of each of the resonators in the first group is equal to one-quarter of the wavelength of said resonant frequency of said first filter, the length of each of the resonators in the second group is equal to one-quarter of the wavelength of said resonant frequency of said second filter, and wherein the length of the common transformer section is equal to an odd number of quarter wavelengths of a frequency that is substantially close to said resonant frequencies of the first and second filters;

wherein a first quarter wavelength section of said odd number of quarter wavelengths in said common transformer section is aligned with resonators of said first group, and a third quarter wavelength section of said odd number of quarter wavelengths in said common transformer section is aligned with resonators of said second group, said first group of resonators being spaced approximately one-quarter wavelength from said second group of resonators by a second quarter wavelength section of said odd number of quarter wavelengths in said common transformer; and wherein each of said resonators of said first and second groups includes a T-shaped structure with a rectangular conductive mounting base and a relatively thin rectangular resonator section integral with the mounting base, each mounting base having opposed faces attached to an inner surface of said first and second face plates to support that resonator.

2. The multiple filter filtering device of claim 1 wherein the first cable connector couples the first filter to a receiver, the second cable connector couples the second filter to a transmitter, and the third cable connector couples both the first and second filters by means of the common transformer resonator to a common antenna.

3. The multiple filter filtering device of claim 1 wherein each of the T-shaped resonators is a piece of extruded copper.

* * * * *